United States Patent
Chen et al.

(10) Patent No.: US 11,614,644 B2
(45) Date of Patent: Mar. 28, 2023

(54) DISPLAY DEVICE

(71) Applicant: Coretronic Corporation, Hsin-Chu (TW)

(72) Inventors: Ping-Yen Chen, Hsin-Chu (TW); Wen-Chun Wang, Hsin-Chu (TW); Chung-Yang Fang, Hsin-Chu (TW); Yang-Ching Lin, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 17/180,866

(22) Filed: Feb. 22, 2021

(65) Prior Publication Data
US 2021/0263352 A1   Aug. 26, 2021

(30) Foreign Application Priority Data
Feb. 26, 2020   (CN) .......................... 202010118343.3

(51) Int. Cl.
*G02F 1/13* (2006.01)
*G02F 1/1335* (2006.01)
(Continued)

(52) U.S. Cl.
CPC .......... *G02F 1/1323* (2013.01); *G02F 1/0136* (2013.01); *G02F 1/137* (2013.01);
(Continued)

(58) Field of Classification Search
CPC ............. G02F 1/1347; G02F 1/133528; G02F 1/133533; G02F 1/1323; G02F 1/133536; G02F 1/0136; G02F 1/137; H01L 51/5281
See application file for complete search history.

(56) References Cited

U.S. PATENT DOCUMENTS

2009/0174843 A1   7/2009 Sakai et al.
2017/0115528 A1*  4/2017 Oh .................... G02F 1/133621
(Continued)

FOREIGN PATENT DOCUMENTS

CN        1969226         5/2007
CN      101051144        10/2007
(Continued)

OTHER PUBLICATIONS

"Office Action of Taiwan Counterpart Application", dated Feb. 9, 2021, p. 1-p. 6.

(Continued)

*Primary Examiner* — Mariam Qureshi
(74) *Attorney, Agent, or Firm* — JCIPRNET (57) ABSTRACT

A display device includes a view angle switching module and a display module. The view angle switching module includes a first polarizer and a view angle adjustment layer. The display module and the view angle switching module are overlapped. The display module includes a display layer and a second polarizer. The view angle adjustment layer is located between the first polarizer and the second polarizer. An average degree of polarization of the first polarizer for light with a wavelength falling within a first wavelength band is less than an average degree of polarization of the second polarizer for the light with the wavelength falling within the first wavelength band. The display device may provide a privacy function and images with good image quality.

12 Claims, 8 Drawing Sheets

(51) Int. Cl.
     *G02F 1/01*          (2006.01)
     *H01L 51/52*        (2006.01)
     *G02F 1/137*       (2006.01)

(52) U.S. Cl.
     CPC .... *G02F 1/133536* (2013.01); *H01L 51/5281* (2013.01); *G02F 2203/07* (2013.01)

(56) References Cited

U.S. PATENT DOCUMENTS

2018/0299726 A1\* 10/2018 Oka .................. G02F 1/133528
2021/0149233 A1\*  5/2021 Robinson .......... G02F 1/133742

FOREIGN PATENT DOCUMENTS

| CN | 101432645 | 5/2009 |
| CN | 102326118 | 1/2012 |
| CN | 106662772 | 5/2017 |
| CN | 109696757 | 4/2019 |
| CN | 110785694 | 2/2020 |
| JP | 2009229901 | 10/2009 |
| TW | 201312163 | 3/2013 |
| TW | 201522442 | 6/2015 |
| TW | 201944106 | 11/2019 |
| WO | 2019208261 | 10/2019 |

OTHER PUBLICATIONS

"Office Action of China Counterpart Application", dated Dec. 2, 2022, pp. 1-8.

\* cited by examiner

DISPLAY DEVICE

CROSS-REFERENCE TO RELATED APPLICATION

This application claims the priority benefit of China patent application serial no. 202010118343.3, filed on Feb. 26, 2020. The entirety of the above-mentioned patent application is hereby incorporated by reference herein and made a part of this specification.

BACKGROUND OF THE INVENTION

Field of the Invention

The invention relates to an optical device, and more particularly, to a display device.

Description of Related Art

With the development of science and technology, display devices have become common electronic devices in daily lives. At present, some display devices provide a privacy function to maintain the viewing privacy of users.

An existing privacy display technology of the display device is mainly to add a liquid crystal view angle switcher in the display device. The liquid crystal view angle switcher changes a polarization state of passing light by switching the state of liquid crystal, so that light emitted from the liquid crystal view angle switcher at different angles has different transmittances for a polarizer, and the light passing through the display device in a privacy mode has a narrow-view divergence angle.

However, in the display device equipped with the liquid crystal view angle switcher, visible lights with different wavelengths have different phase values on the same path. As such, even at the same view angle, the visible lights with different wavelengths have different transmittances for the polarizer. In this case, if a white beam passes through the liquid crystal view angle switcher in the privacy mode, only a part of light with a specific wavelength is absorbed by the polarizer at the same view angle. In addition, as the view angles are different, the optical path length may be different. Therefore, at different view angles, the wavelength of light that can be absorbed by the polarizer also changes. Accordingly, when the display device is switched to the privacy mode and displays a simple image (such as a white image), if the position of the user is moved, the view angle is changed, and an abnormal color change on both sides of the display device may be observed.

For instance, when an optical phase difference of the liquid crystal view angle switcher is 0.8 micron (um), if the view angle is from 0 degrees to 10 degrees, the observed color is roughly white to light yellow. If the view angle is from 20 degrees to 40 degrees, the color is gradually changed to yellow brown. If the view angle is from 40 degrees to 45 degrees, the color is gradually changed to purple. If the view angle is greater than 45 degrees, the color is changed to dark blue to light blue. As such, when a display size of the display device is relatively large (e.g., a 14-inch display), the user may feel that both sides of the display device appear yellowish at a normal viewing distance.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY OF THE INVENTION

The invention provides a display device, which can provide a privacy function and images with good image quality.

Other objectives and advantages of the invention may be illustrated by the technical features broadly embodied and described as follows.

In order to achieve one or a part or all of the foregoing objectives or other objectives, one embodiment of the invention provides a display device, including a view angle switching module and a display module. The view angle switching module includes a first polarizer and a view angle adjustment layer. The display module and the view angle switching module are overlapped. The display module includes a display layer and a second polarizer. The view angle adjustment layer is located between the first polarizer and the second polarizer. An average degree of polarization of the first polarizer for light with a wavelength falling within a first wavelength band is less than an average degree of polarization of the second polarizer for the light with the wavelength falling within the first wavelength band.

Based on the foregoing, one or more embodiments of the invention have at least one of the following advantages or effects. In the display device provided in one or more embodiments of the invention, since the degree of polarization of the first polarizer for the light with the wavelength falling within the first wavelength band is less than the degree of polarization of the second polarizer for the light with the wavelength falling within the first wavelength band, a proportion of the light, with the wavelength falling within the first wavelength band, passing through the view angle switching module may be increased. Therefore, the display device in a privacy mode may compensate for a color shift at a specific view angle. As such, while performing the privacy function, the display device may also provide the images with good image quality and improve the comfort of a user during use.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
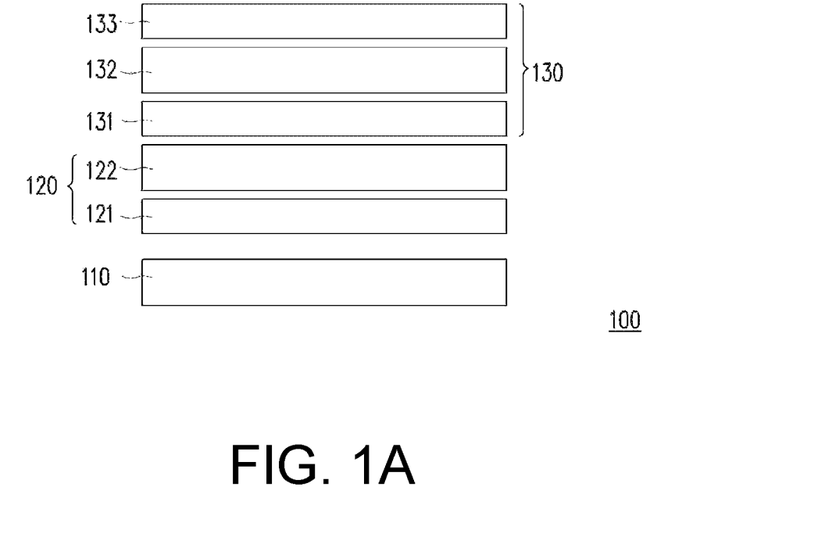
FIG. 1A is a schematic structural diagram of a display device according to an embodiment of the invention.
Figure 1B:
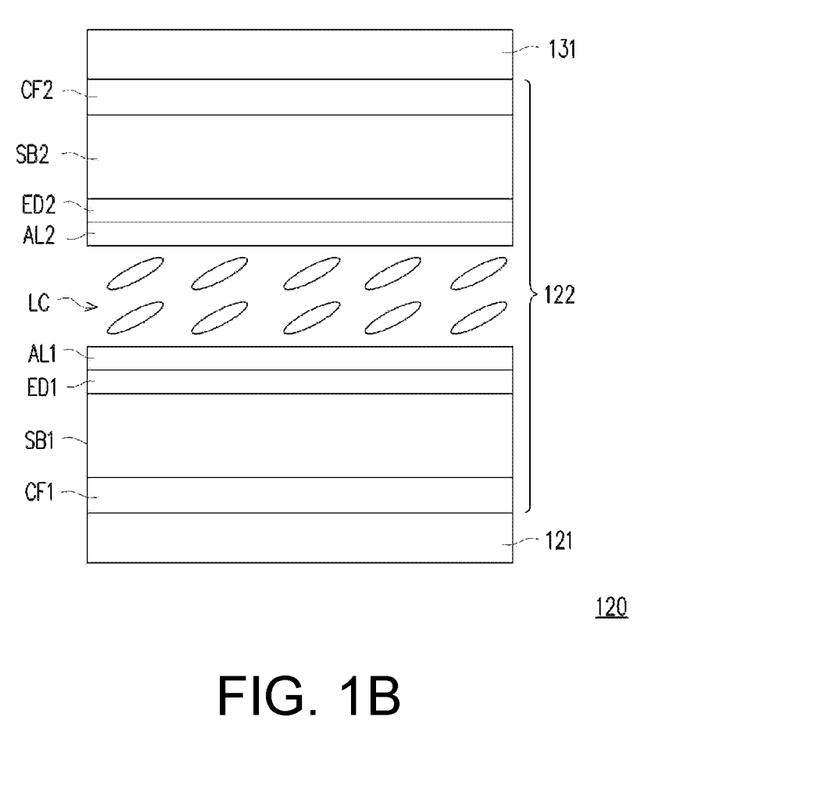
FIG. 1B is a schematic structural diagram of a view angle switching module according to an embodiment of the invention.

FIG. 1A is a schematic structural diagram of a display device according to an embodiment of the invention. FIG. 1B is a schematic structural diagram of a view angle switching module according to an embodiment of the invention. Referring to FIG. 1A, a display device 100 of the embodiment includes a view angle switching module 120 and a display module 130. The view angle switching module 120 includes a first polarizer 121 and a view angle adjustment layer 122. The display module 130 and the view angle switching module 120 are overlapped. The display module includes a display layer 132 and a second polarizer 131. The view angle adjustment layer 122 is located between the first polarizer 121 and the second polarizer 131. The display device 100 may optionally include a light source module 110 configured to provide an illumination beam (not shown). For example, the light source module 110 may be a light-condensing backlight module with a light deflector or a general backlight module. The general backlight module refers to an assembly using a brightness enhancement film (such as a 3M prismatic film) and a diffusion film. Compared with the general backlight module, the light-condensing backlight module has a smaller range of light emitting angles. The invention is not limited thereto. The illumination beam sequentially passes through the view angle switching module 120 and the display module 130 to form a display beam (not shown). In other words, the view angle switching module 120 is disposed between the light source module 110 and the display module 130. Specifically, the view angle switching module 120 is configured to switch a light emitting view angle range of the illumination beam, thereby changing a light emitting view angle range of the display beam, and at least two different view angle ranges, such as a normal viewing mode having wide-viewing angle and a privacy mode having narrow-viewing angle, may be provided.

More specifically, as shown in FIG. 1A, in the embodiment, the view angle switching module 120 and the display module 130 are disposed on a transmission path of the illumination beam. On the other hand, as shown in FIG. 1A, the display module 130 may further optionally include a third polarizer 133. The view angle adjustment layer 122 is located between the first polarizer 121 and the second polarizer 131. The display layer 132 is located between the second polarizer 131 and the third polarizer 133. The second polarizer 131 is located between the view angle adjustment layer 122 and the display layer 132. In particular, in the embodiment, the view angle switching module 120 and the display module 130 actually share the functions of the second polarizer 131, and the display module 130 includes the second polarizer 131, but the invention is not limited thereto. In other embodiments, the view angle switching module 120 may include the second polarizer 131.

Specifically, as shown in FIG. 1A and FIG. 1B, in the embodiment, the first polarizer 121 and the second polarizer 131 are sequentially disposed on the transmission path of the illumination beam. The transmission axes of the first polarizer 121 and the second polarizer 131 are arranged in parallel or nearly in parallel. For example, an included angle between the transmission axes of the first polarizer 121 and the second polarizer 131 falls within a range of 0 degrees to 15 degrees. The view angle adjustment layer 122 is also disposed on the transmission path of the illumination beam, located between the first polarizer 121 and the second polarizer 131, and configured to change the light emitting angle range (viewing angle) of the illumination beam, for example, from a wide light emitting angle range to a narrow light emitting angle range.

Further, as shown in FIG. 1A and FIG. 1B, the view angle adjustment layer 122 includes a liquid crystal layer LC, a first substrate SB1 and a second substrate SB2. The first substrate SB1 and the second substrate SB2 are located between the first polarizer 121 and the second polarizer 131, and the liquid crystal layer LC is located between the first substrate SB1 and the second substrate SB2. Specifically, the first substrate SB1 or the second substrate SB2 may be a general glass substrate. The invention is not limited thereto.

In the embodiment, as shown in FIG. 1B, the view angle adjustment layer 122 further includes a first alignment layer AL1, a second alignment layer AL2, a first electrode ED1, and a second electrode ED2. The first electrode ED1 and the second electrode ED2 are disposed on opposite sides of the liquid crystal layer LC respectively, and are configured to provide an applied voltage to the liquid crystal layer LC to change an arrangement direction of liquid crystal molecules in the liquid crystal layer LC. The liquid crystal molecules of the liquid crystal layer LC are, for example but not limited to, nematic liquid crystals. The first alignment layer AL1 and the second alignment layer AL2 are also disposed on opposite sides of the liquid crystal layer LC. The first alignment layer AL1 is located between the first electrode ED1 and the liquid crystal layer LC, and the second alignment layer AL2 is located between the liquid crystal layer LC and the second electrode ED2. Alignment directions of the first alignment layer AL1 and the second alignment layer AL2 are substantially antiparallel and have an included angle within a range of 0 degrees to 15 degrees. In addition, the first alignment layer AL1 is disposed between the liquid crystal layer LC and the first polarizer 121, and the second alignment layer AL2 is disposed between the liquid crystal layer LC and the second polarizer 131. A transmission axis direction of the first polarizer 121 or the second polarizer 131 is parallel or vertical to or nearly parallel or vertical to the alignment direction of the corresponding first alignment layer AL1 or second alignment layer AL2.

In this way, the liquid crystal molecules in the liquid crystal layer LC will change the arrangement direction according to the applied voltage between the first electrode ED1 and the second electrode ED2, thereby changing the light emitting angle range of the illumination beam.

In addition, in the embodiment, the view angle switching module 120 may also optionally provide a compensation film between the first polarizer 121 and the second polarizer 131. For example, the view angle switching module 120 may include a first compensation film CF1 and/or a second compensation film CF2. The first compensation film CF1 is disposed between the first polarizer 121 and the first substrate SB1, and the first compensation film CF1 is disposed between the first polarizer 121 and the view angle adjustment layer 122. The second compensation film CF2 is disposed between the second polarizer 131 and the first substrate SB1, and the second compensation film CF2 is disposed between the second polarizer 131 and the view angle adjustment layer 122. For example, the type of the compensation film may be a double-layer A-type plate compensation film, a biaxial compensation film, or a negative C-type plate compensation film. The phase retardation (Rth phase value) of the compensation film may fall within a range of 200 nm to 700 nm, preferably in a range of 400 nm to 450 nm. In this way, the view angle switching module 120 may provide the required phase retardation through the first compensation film CF1 and/or the second compensation film CF2, thereby achieving the effect of limiting the view angle at an azimuth angle to be controlled.

On the other hand, the display layer 132 of the display module 130 also includes a liquid crystal layer (not shown), an electrode layer (not shown), and a color filter (not shown). The color filter has red, green and blue photoresists. Moreover, the third polarizer 133 and the second polarizer 131 are disposed on opposite sides of the display layer 132, and the transmission axis directions between the third polarizer 133 and the second polarizer 131 are vertical to each other. In other words, in the embodiment, the display module 130 is a liquid crystal display panel, and the second polarizer 131 and the third polarizer 133 are upper and lower polarizers of the display module 130, but the invention is not limited thereto.

In the embodiment, the display device 100 adopts a configuration in which the first polarizer 121 and the second polarizer 131 have different average degree of polarizations for light with a wavelength falling within a first wavelength band, so that the display device 100 in a privacy mode can compensate for a color shift at a specific view angle. Therefore, while providing a privacy function, the display device may also provide images with good image quality. This will be further explained below with reference to FIG. 2A to FIG. 2C.

Figure 2A:
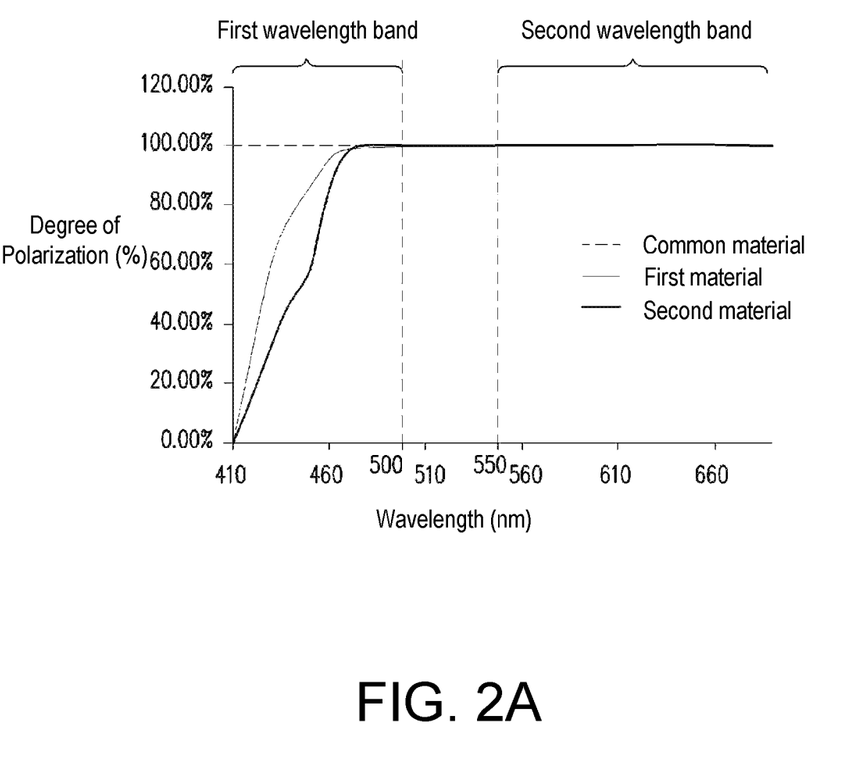
FIG. 2A is a diagram of a relation curve of degree of polarizations of materials of a first polarizer and a second polarizer for light in different wavelength bands according to an embodiment of the invention.

FIG. 2A is a diagram of a relation curve of degree of polarizations of materials of a first polarizer and a second polarizer for light in different wavelength bands according to an embodiment of the invention. Specifically, in the embodiment, the first polarizer 121 may be made of a first material or a second material, and the second polarizer 131 and the third polarizer 133 may be made of a common material. More specifically, the diagram of the relation curve of the degree of polarizations of the first material, the second material and the common material for the light in different wavelength bands is shown in FIG. 2A. From the relation curve shown in FIG. 2A, it can be seen that the degree of polarization of the common material for light with a wavelength falling within a visible light wavelength band range is about a fixed value, which is greater than 90% and approximate to 100%. In other words, the average degrees of polarizations of the common material for the light with the wavelength falling within different ranges of the visible light wavelength band range are roughly the same. On the other hand, an average degree of polarization of the first material or the second material for the light with the wavelength falling within the first wavelength band is less than an average degree of polarization for light with a wavelength falling within a second wavelength band. Moreover, the average degree of polarization of the first material or the second material for the light with the wavelength falling within the first wavelength band is less than the average degree of polarization of the common material, and the average degree of polarization of the first material or the second material for the light with the wavelength falling within the second wavelength band is roughly the same as the average degree of polarization of the common material. In the embodiment, the first wavelength band may be set to be from 410 nm to 500 nm, and preferably from 450 nm to 460 nm, and the second wavelength band is from 530 nm to 570 nm. In other words, in the embodiment, the first wavelength band is a blue light wavelength band, and the second wavelength band is a yellow-green light wavelength band, but the invention is not limited thereto. For example, in the embodiment, the average degree of polarization of the first material or the second material for the light with the wavelength falling within the first wavelength band is from 45% to 90%, and the average degree of polarization for the light with the wavelength falling within the second wavelength band is from 85% to 99.999%. It is worth mentioning that the first polarizer 121 may be implemented by a single polarizer, or may be composed of at least two polarizers, so as to achieve the effect that the average degree of polarization for the light with the wavelength falling within the first wavelength band is from 45% to 90%, and the average degree of polarization for the light with the wavelength falling within the second wavelength band is from 85% to 99.999%.

That is, the average degree of polarization of the first polarizer 121 made of the first material or the second material for the light with the wavelength falling within the first wavelength band is less than the average degree of polarization of the second polarizer 131 made of the common material for the light with the wavelength falling within the first wavelength band, and the average degree of polarization of the first polarizer 121 made of the first material or the second material for the light with the wavelength falling within the first wavelength band is less than the average degree of polarization for the light with the wavelength falling within the second wavelength band. In addition, since the second polarizer 131 and the third polarizer 133 are both made of the common material, the average degrees of polarizations of the second polarizer 131 and the third polarizer 133 are the same. It is worth noting that the same average degree of polarization here may allow differences within a certain error range, such as a tolerance of polarizer production. For example, if the value of a difference range is less than 3%, the average degree of polarizations may be regarded as the same.

In more detail, a degree of polarization of a polarizer is a value configured to represent an overall efficiency value of the polarizer generating polarized light. A transmittance through the polarizer is defined as follows: $V=(T0-T90/T0+T90)^{1/2}$. V is the degree of polarization. T0 is a parallel transmittance, which is the transmittance of two superimposed polarizers with parallel absorption axes. T90 is a vertical transmittance, which is the transmittance of two superimposed polarizers with vertical absorption axes.

Furthermore, from the above formula, it can be known that when the degree of polarization of the polarizer is approximate to 100% (i.e., in the case of the common material), it means that the vertical transmittance T90 is extremely small (a contrast of T0-T90 is high). Conversely, when the degree of polarization of the polarizer is lower, it means that the parallel transmittance T0 and the vertical transmittance T90 are closer (the contrast of T0-T90 is low). In this case, the display module 130 that uses the second polarizer 131 and the third polarizer 133 having the same common material as upper and lower polarizers thereof may have a good T0-T90 contrast for the light with the wavelength falling within the visible light wavelength band range. The view angle switching module 120 that uses the first polarizer 121 and the second polarizer 131 having different materials as upper and lower polarizers thereof may have different T0-T90 contrasts for the light with the wavelength falling within the first wavelength band or the second wavelength band. The view angle switching module 120 and the second polarizer 131 have a lower T0-T90 contrast for the light with the wavelength falling within the first wavelength band. That is, light within the first wavelength band passing through the first polarizer 121 may have light parallel to the transmission axis of the first polarizer 121 and light vertical to the transmission axis of the first polarizer 121. Therefore, the light within the first wavelength band may be allowed to have a higher transmittance than the polarizer made of a common material at an oblique view angle in the privacy mode. In this way, a color shift at a specific view angle may be compensated. This will be further explained below with reference to FIG. 2A to FIG. 2C.

Figure 2B:
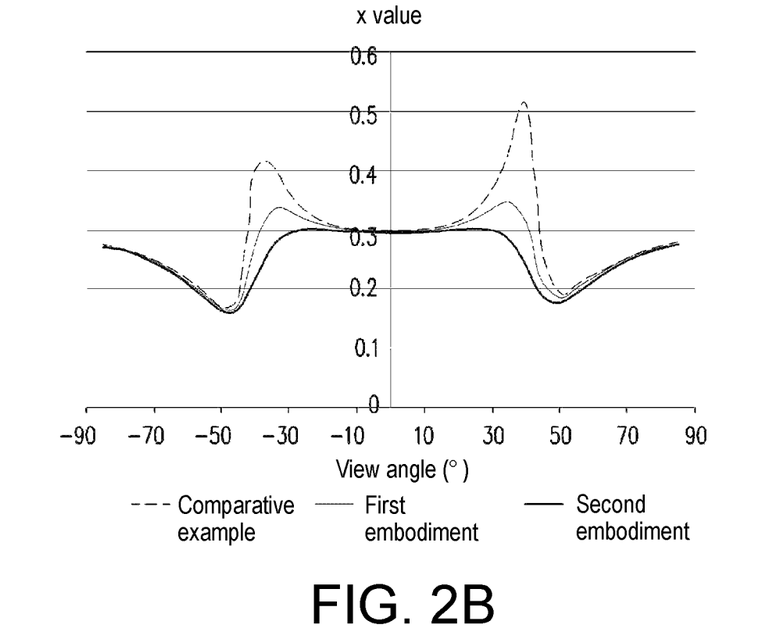
FIG. 2B is a diagram illustrating a correspondence between a view angle of a display device in a privacy mode and a color coordinate x value according to different embodiments and a comparative example of the invention.
Figure 2C:
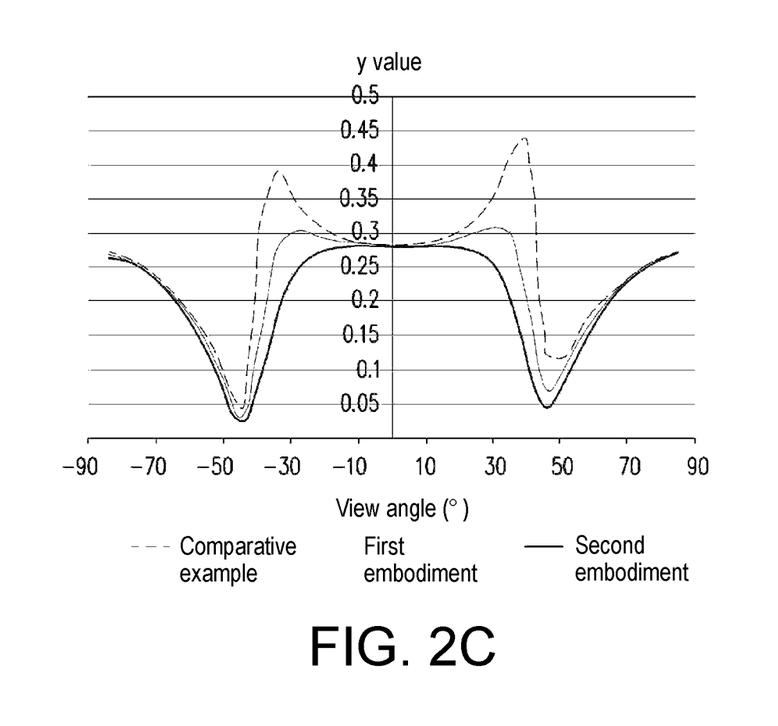
FIG. 2C is a diagram illustrating a correspondence between the view angle of the display device in the privacy mode and a color coordinate y value according to different embodiments and the comparative example of the invention.

FIG. 2B is a diagram illustrating a correspondence between a view angle of a display device in a privacy mode and a color coordinate x value according to different embodiments and a comparative example of the invention. FIG. 2C is a diagram illustrating a correspondence between the view angle of the display device in the privacy mode and a color coordinate y value according to different embodiments and the comparative example of the invention. Referring to FIG. 2B and FIG. 2C at the same time, a first polarizer 121 and a second polarizer 131 of a view angle switching module 120 of the display device in the comparative example are made of common materials. If the view angle of two edges of the display device 100 relative to that of a middle position is about 21 degrees (for example, if a display surface size of the display device 100 is about 14 inches and a visible distance is about 50 cm), a yellowish display effect occurs, and the position of color coordinates is also obviously shifted, which will affect the comfort of a user during use.

On the other hand, as shown in FIG. 2A to FIG. 2C, in order to compensate for the yellow color shift in the invention, in a first embodiment, the first polarizer 121 of the view angle switching module 120 of the display device 100 is made of the first material, and in a second embodiment, the first polarizer 121 of the view angle switching module 120 of the display device 100 is made of the second material. For example, in the first embodiment and the second embodiment, the first material and the second material may be selected from a material of a dye-based polarizer using a blue dye, or a material of an iodine-based polarizer.

In this way, as shown in FIG. 2B and FIG. 2C, in the privacy mode, since a blue light wavelength band is passable, the display device 100 of the embodiment can suppress the x value and the y value of the color coordinates in a range where the view angle is plus or minus 20 degrees from shifting. That is, the color shift can be suppressed in a range where the view angle is plus or minus 20 degrees. In particular, although the color shift still occurs when the view angle exceeds 20 degrees, the color shift of the polarizer made of the first material or the second material is still effectively reduced as compared to the polarizer made of the common material in the invention. On the other hand, although the display device 100 of the first embodiment and the second embodiment still has the color shift when the view angle exceeds a range of plus or minus 20 degrees, since the display mode is the privacy mode and the angle has exceeded the viewing range of a user, the comfort of the user during use will not be affected. Moreover, the second polarizer 131 and the third polarizer 133 made of the same common material are also disposed on the other side of the view angle switching module 120 relative to the first polarizer 121, and a T0-T90 contrast for blue light is also good. Therefore, the blue light passing through the first polarizer 121 does not cause a blue shift to a front-view picture, and does not affect a normal viewing mode.

In this way, by means of a configuration in which the average degree of polarization of the first polarizer 121 for the light with the wavelength falling within the first wavelength band is less than the average degree of polarization of the second polarizer 131 for the light with the wavelength falling within the first wavelength band, the display device 100 in the first embodiment and the second embodiment can increase a proportion of the light, with the wavelength falling within the first wavelength band, passing through the view angle switching module 120. Therefore, the display device 100 in the privacy mode can compensate for the color shift at the specific view angle. In this way, while providing a privacy function, the display device 100 may also provide images with good image quality and improve the comfort of the user during use.

Figure 3:
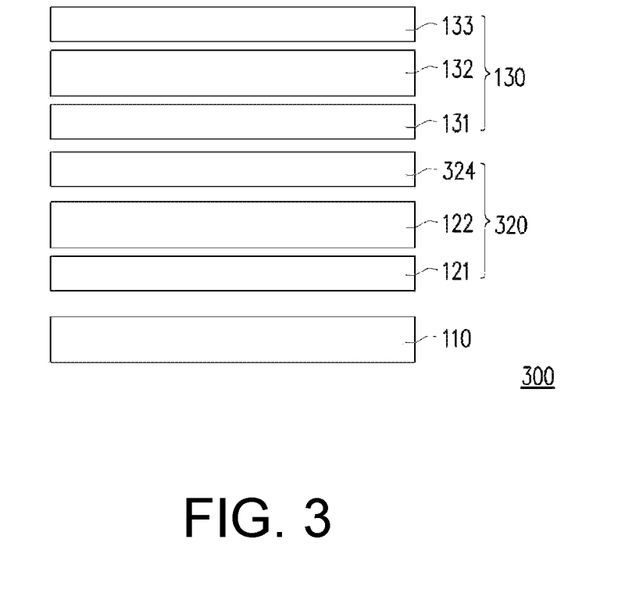
FIG. 3 is a schematic structural diagram of another display device according to an embodiment of the invention.

FIG. 3 is a schematic structural diagram of another display device according to an embodiment of the invention. Referring to FIG. 3, a display device 300 in FIG. 3 is similar to the display device 100 in FIG. 1A, and the differences are as follows. As shown in FIG. 3, in the embodiment, a view angle switching module 320 further includes a fourth polarizer 324 located between the view angle adjustment layer 122 and the second polarizer 131. Specifically, in the embodiment, the first polarizer 121 and the fourth polarizer 324 serve as upper and lower polarizers of the view angle switching module 320. That is, the arrangement direction of the transmission axes of the first polarizer 121 and the fourth polarizer 324 of the view angle switching module 320 is the same as the arrangement direction of the transmission axes of the first polarizer 121 and the second polarizer 131 of the view angle switching module 120. Related details are shown with respect to relevant paragraphs. The descriptions thereof are omitted herein.

Specifically, in the embodiment, the average degrees of polarizations of the first polarizer 121 and the fourth polarizer 324 are the same. That is, the average degree of polarization of the fourth polarizer 324 for the light with the wavelength falling within the first wavelength band is less than the average degree of polarization of the second polarizer 131 for the light with the wavelength falling within the first wavelength band, and the average degree of polarization of the fourth polarizer 324 for the light with the wavelength falling within the first wavelength band is less than an average degree of polarization of the fourth polarizer 324 for the light with the wavelength falling within the second wavelength band. In addition, the view angle switching module 320 may also optionally provide a compensation film (not shown) between the first polarizer 121 and the fourth polarizer 324. In this way, the view angle switching module 320 may also provide the required phase retardation through the compensation film, thereby improving the image quality.

In this way, by means of a configuration in which the average degree of polarizations of the first polarizer 121 and the fourth polarizer 324 for the light with the wavelength falling within the first wavelength band are less than the average degree of polarization of the second polarizer 131 for the light with the wavelength falling within the first wavelength band, the display device 300 can increase a proportion of the light, with the wavelength falling within the first wavelength band, passing through the view angle switching module 320. Therefore, the display device 300 in the privacy mode can compensate for a color shift at a specific view angle. In this way, while providing a privacy function, the display device 300 may also provide images with good image quality and improve the comfort of a user during use. The display device can have the advantages mentioned in the foregoing display device 100. The descriptions thereof are omitted herein.

Figure 4:
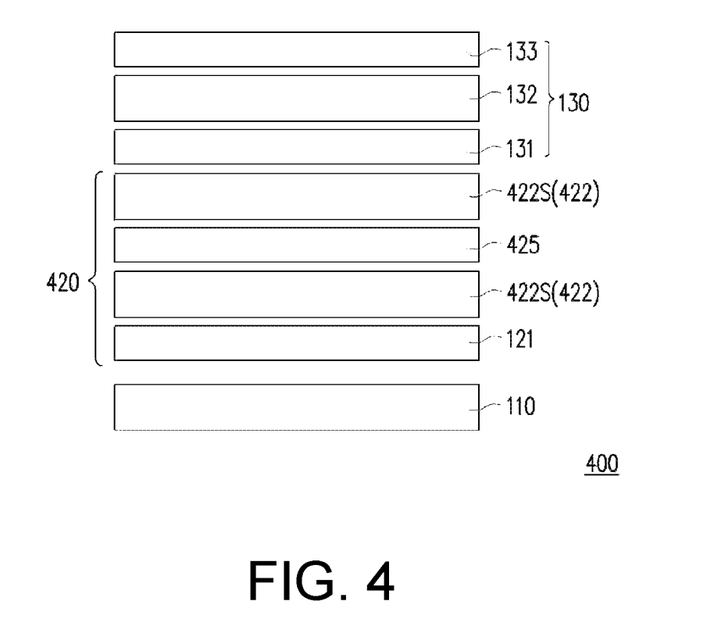
FIG. 4 is a schematic structural diagram of yet another display device according to an embodiment of the invention.

FIG. 4 is a schematic structural diagram of yet another display device according to an embodiment of the invention. Referring to FIG. 4, a display device 400 in FIG. 4 is similar to the display device 100 in FIG. 1A, and the differences are as follows. As shown in FIG. 4, in the embodiment, a view angle adjustment layer 422 includes a plurality of sub-view angle adjustment layers 422S. In this way, by means of the configuration of the plurality of sub-view angle adjustment layers 422S, a view angle switching module 420 may adjust a view angle of an illumination beam for multiple times. In this way, a privacy view angle of the display device 400 may be further reduced, or the display device may be used in combination with the light source module 110 that provides the illumination beam in the larger divergence angle.

Furthermore, in the embodiment, the view angle switching module 420 further includes at least one fifth polarizer 425. Each of the fifth polarizers 425 is located between two adjacent sub-view angle adjustment layers 422S. The average degrees of polarizations of the first polarizer 121 and each of the fifth polarizers 425 are the same. That is, the average degree of polarization of each of the fifth polarizers 425 for the light with the wavelength falling within the first wavelength band is less than the average degree of polarization of the second polarizer 131 for the light with the wavelength falling within the first wavelength band, and the average degree of polarization of each of the fifth polarizers 425 for the light with the wavelength falling within the first wavelength band is less than the average degree of polarization of each of the fifth polarizers 425 for the light with the wavelength falling within the second wavelength band.

In this way, by means of a configuration in which the average degree of polarizations of the first polarizer 121 and each of the fifth polarizers 425 for light with the wavelength falling within the first wavelength band are less than the average degree of polarization of the second polarizer 131 for the light with the wavelength falling within the first wavelength band, the display device 400 can increase a proportion of the light, with the wavelength falling within the first wavelength band, passing through the view angle switching module 420. Therefore, the display device 400 in the privacy mode can compensate for a color shift at a specific view angle. In this way, while providing a privacy function, the display device 400 may also provide images with good image quality and improve the comfort of a user during use. The display device can have the advantages mentioned in the foregoing display device 100. The descriptions thereof are omitted herein.

Figure 5:
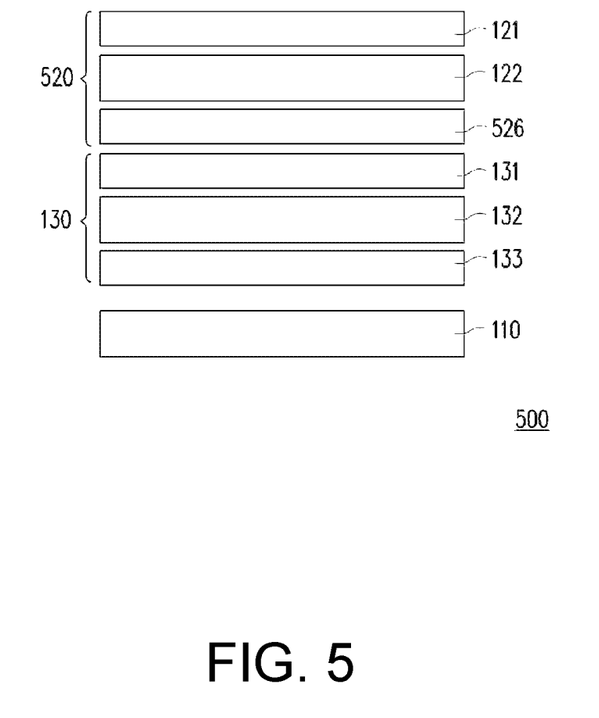
FIG. 5 is a schematic structural diagram of yet another display device according to an embodiment of the invention.

FIG. 5 is a schematic structural diagram of yet another display device according to an embodiment of the invention. Referring to FIG. 5, a display device 500 in FIG. 5 is similar to the display device 100 in FIG. 1A, and the differences are as follows. As shown in FIG. 5, in the embodiment, the display module 130 is located between the light source module 110 and a view angle switching module 520. That is, the illumination beam of the light source module 110 first passes through the display module 130 to form the display beam. The view angle switching module 520 is configured to switch the light emitting angle range (viewing angle) of the display beam, and may provide a normal viewing mode having wide-viewing angle and a privacy mode having narrow-viewing angle.

Moreover, by means of a configuration in which the average degree of polarization of the first polarizer 121 for the light with the wavelength falling within the first wavelength band is less than the average degree of polarization of the second polarizer 131 for the light with the wavelength falling within the first wavelength band, the display device 500 can increase a proportion of the light, with the wavelength falling within the first wavelength band, passing through the view angle switching module 520. Therefore, the display device 500 in the privacy mode can compensate for a color shift at a specific view angle. In this way, while providing a privacy function, the display device 500 may also provide images with good image quality and improve the comfort of a user during use. The display device can have the advantages mentioned in the foregoing display device 100. The descriptions thereof are omitted herein.

In addition, in the embodiment, the view angle switching module 520 may further optionally include a reflective polarizer 526 located between the view angle adjustment layer 122 and the second polarizer 131. Specifically, in the embodiment, the first polarizer 121 and the reflective polarizer 526 serve as upper and lower polarizers of the view angle switching module 520. That is, the arrangement direction of the transmission axes of the first polarizer 121 and the reflective polarizer 526 of the view angle switching module 520 is the same as the arrangement direction of the transmission axes of the first polarizer 121 and the second polarizer 131 of the view angle switching module 120. Related details are shown with respect to relevant paragraphs. The descriptions thereof are omitted herein.

Furthermore, by means of the configuration of the reflective polarizer 526, when ambient light from the outside enters the display device 500 in the privacy mode obliquely, a polarization state thereof is changed by the view angle switching module 520. The ambient light penetrates the first polarizer 121 after being reflected via the reflective polarizer 526 and passing through the view angle switching module 520 again to make the polarization state changed again. That is, when the display device 500 is viewed at an oblique view, the reflected ambient light is observed. In this way, the privacy effect of the display device 500 may be further improved. In addition, when the ambient light from the outside enters the display device 500 in the privacy mode forwardly, since the view angle switching module 520 does not change the polarization state of light entering forwardly, the ambient light directly penetrates the reflective polarizer 526. In this way, when the display device 500 is viewed at a forward view, the reflected ambient light is not observed. Therefore, while the privacy effect is improved, the display image quality of the display device 500 at the forward view angle is not affected.

It is worth noting that in the foregoing embodiments, the display devices 100, 300, 400, and 500 are exemplified by having the light source module 110 and the display module 130 simultaneously, but the invention is not limited thereto. In other embodiments, the display module 130 may be a self-luminous display module. The display layer may be a self-luminous display layer, such as an Organic Light Emitting Diode (OLED). The configuration of the light source module 110 and partial polarizers is omitted. This will be further explained below with reference to FIG. 6 to FIG. 11.

Figure 6:
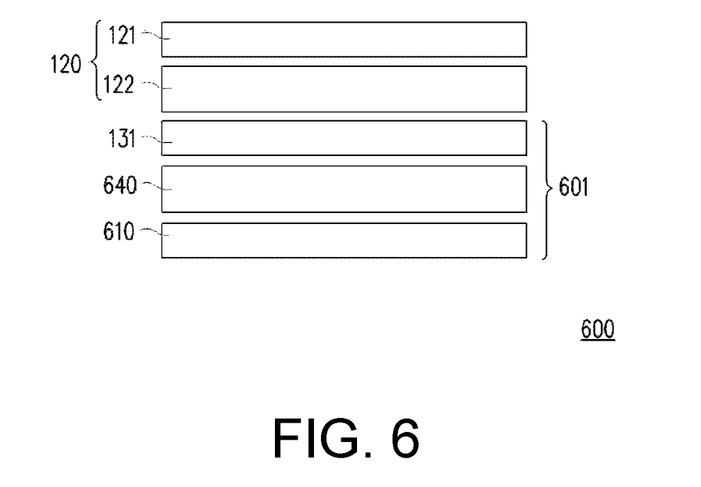
FIG. 6 to FIG. 11 are schematic structural diagrams of yet another display device according to an embodiment of the invention.

FIG. 6 is a schematic structural diagram of yet another display device according to an embodiment of the invention. Referring to FIG. 6, a display device 600 in FIG. 6 is similar to the display device 100 in FIG. 1A, and the differences are as follows. In the embodiment, a self-luminous display module 601 includes a self-luminous display layer 610 and the second polarizer 131 configured to provide a display beam (not shown), and the self-luminous display module 601 is, for example, an OLED display module, but the invention is not limited thereto. The self-luminous display module 601 may optionally further include a phase retardation film 640. The phase retardation film 640 is located between the second polarizer 131 and the self-luminous display layer 610. The second polarizer 131 is located between the view angle adjustment layer 122 and the self-luminous display layer 610. For example, in the embodiment, the phase retardation film 640 may be a quarter-wavelength phase retarder. In this way, when the ambient light passes through the second polarizer 131, it may be polarized into linearly polarized light, and meanwhile, half of the light is absorbed by the second polarizer 131. In addition, the phase retardation film 640 converts the linearly polarized light into circularly polarized light. When the ambient light is reflected by a metal cathode of the OLED as the self-luminous display layer 610 and passes through the phase retardation film 640 again, it is converted into linearly polarized light again and enters the second polarizer 131. At this time, the polarizing direction of the linearly polarized light passing through the second polarizer 131 for the second time is vertical to the polarizing direction of the linearly polarized light passing through the second polarizer 131 for the first time, and it is exactly the absorption axis direction of the second polarizer 131. Thus, when the self-luminous display layer 610 is the OLED, the ambient light reflected by the cathode thereof may be eliminated, thereby improving the contrast of the display device 600.

Moreover, in the embodiment, since the display device 600 also has a configuration of the view angle switching module 120, by means of a configuration in which the average degree of polarization of the first polarizer 121 for the light with the wavelength falling within the first wavelength band is less than the average degree of polarization of the second polarizer 131 for the light with the wavelength falling within the first wavelength band, a proportion of the light, with the wavelength falling within the first wavelength band, passing through the view angle switching module 120 can be increased. Therefore, the display device 600 in the privacy mode can compensate for a color shift at a specific view angle. In this way, while providing a privacy function, the display device 600 may also provide images with good image quality and improve the comfort of a user during use. The display device can have the advantages mentioned in the foregoing display device 100. The descriptions thereof are omitted herein. In particular, in the embodiment, the view angle switching module 120 and the self-luminous display module 601 actually share the functions of the second polarizer 131, and the self-luminous display module 601 includes the second polarizer 131, but the invention is not limited thereto. In other embodiments, the second polarizer 131 may be included in the view angle switching module 120.

Figure 7:
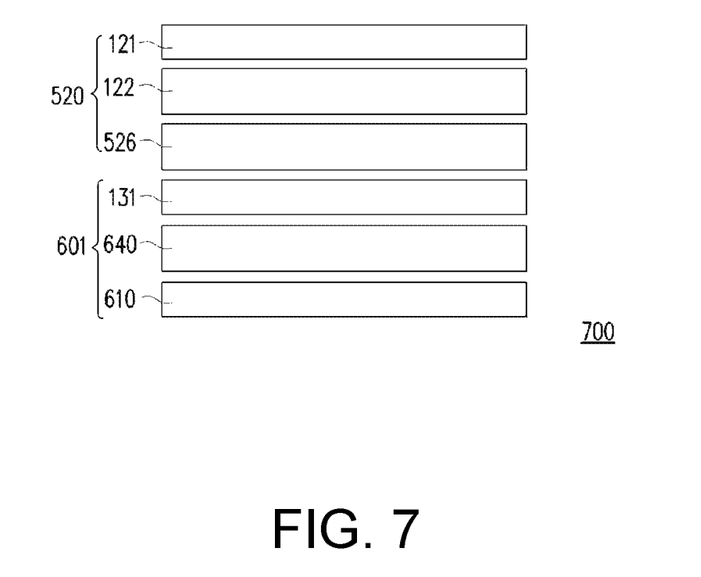

FIG. 7 is a schematic structural diagram of yet another display device according to an embodiment of the invention. Referring to FIG. 7, a display device 700 in FIG. 7 is similar to the display device 500 in FIG. 5 and the display device 600 in FIG. 6, and the differences are as follows. In the embodiment, a view angle switching module 520 of the display device 700 in FIG. 7 is the same as the view angle switching module 520 of the display device 500 in FIG. 5, a display module 601 of the display device 700 in FIG. 7 is the same as the display module 601 of the display device 600 in FIG. 6, and the display device 700 is also configured with the second polarizer 131. In this way, by means of a configuration in which the average degree of polarization of the first polarizer 121 for the light with the wavelength falling within the first wavelength band is less than the average degree of polarization of the second polarizer 131 for the light with the wavelength falling within the first wavelength band, the display device 700 can also increase a proportion of the light, with the wavelength falling within the first wavelength band, passing through the view angle switching module 520. Therefore, the display device 700 in the privacy mode can compensate for a color shift at a specific view angle.

Moreover, the display device 700 may also reflect an ambient beam entering at an oblique view angle by means of the configuration of the reflective polarizer 526 of the view angle switching module 520, and enable an ambient beam entering at a forward view to pass through the view angle switching module 520. Therefore, while the privacy effect is improved, the display image quality of the display device 700 at the forward view angle is not affected. In this way, while providing a privacy function, the display device 700 may also provide images with good image quality and improve the comfort of a user during use. The display device can have the advantages mentioned in the foregoing display device 500 and display device 600. The descriptions thereof are omitted herein.

Figure 8:
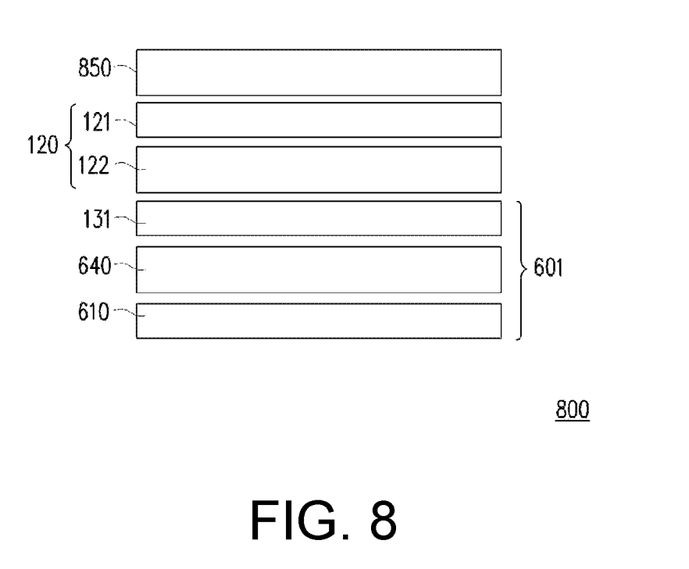
Figure 9:
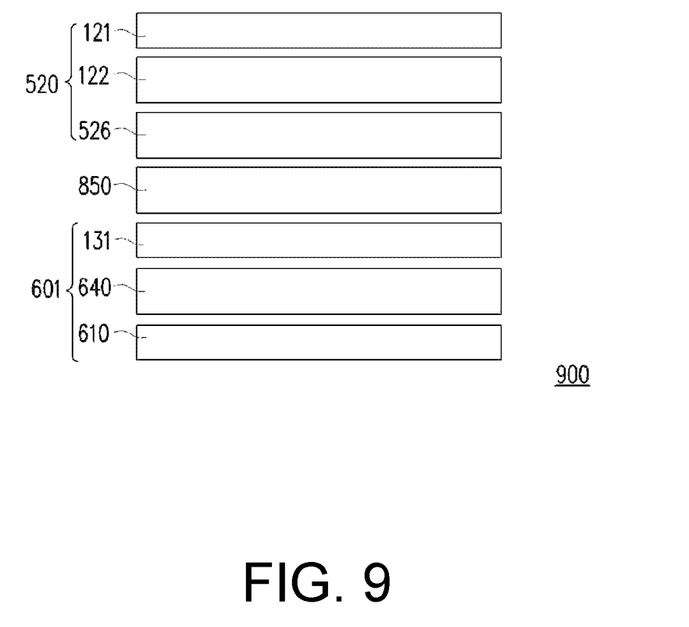

FIG. 8 and FIG. 9 are schematic structural diagrams of different display devices according to an embodiment of the invention. Referring to FIG. 8 and FIG. 9, a display device 800 in FIG. 8 and a display device 900 in FIG. 9 are similar to the display device 600 in FIG. 6 and the display device 700 in FIG. 7 respectively, and the differences are as follows. In the embodiments of FIG. 8 and FIG. 9, a view angle control film 850 is further included. For example, in the embodiment, the view angle control film 850 may be a louver film, a multilayer film (such as Toray's PICASUS VT), or a polarized view angle control element. In this way, the view angle of the display beam provided by the self-luminous display module 601 may be limited, thereby improving the privacy effect.

Specifically, the view angle control film 850 may be disposed above the self-luminous display layer 610 and the second polarizer 131, and the arrangement position thereof may be adjusted according to the structures of different view angle switching modules. For example, in the embodiment of FIG. 8, the view angle control film 850 is disposed on the outermost side of the display device 800 provided with the view angle switching module 120, that is, the first polarizer 121 is located between the view angle control film 850 and the view angle adjustment layer 122. On the other hand, in the embodiment of FIG. 9, the view angle control film 850 may be disposed between the reflective polarizer 526 and the second polarizer 131 of the display device 900 provided with the view angle switching module 520.

In this way, in the embodiments of FIG. 8 and FIG. 9, the display device 800 has a configuration of the view angle switching module 120, and the display device 900 also has a configuration of the view angle switching module 520 and the second polarizer 131. Therefore, by means of configurations in which the average degree of polarization of the first polarizer 121 for the light with the wavelength falling within the first wavelength band is less than the average degree of polarization of the second polarizer 131 for the light with the wavelength falling within the first wavelength band, the display device 800 and the display device 900 can increase proportions of the light, with the wavelength falling within the first wavelength band, passing through the view angle switching module 120 and the view angle switching module 520 respectively. Therefore, the display device 800 and the display device 900 in the privacy mode can compensate for a color shift at a specific view angle. In this way, while providing privacy functions, the display device 800 and the display device 900 may also provide images with good image quality and improve the comfort of a user during use. The display device can have the advantages mentioned in the foregoing display device 600 and display device 700 respectively. The descriptions thereof are omitted herein.

Figure 10:
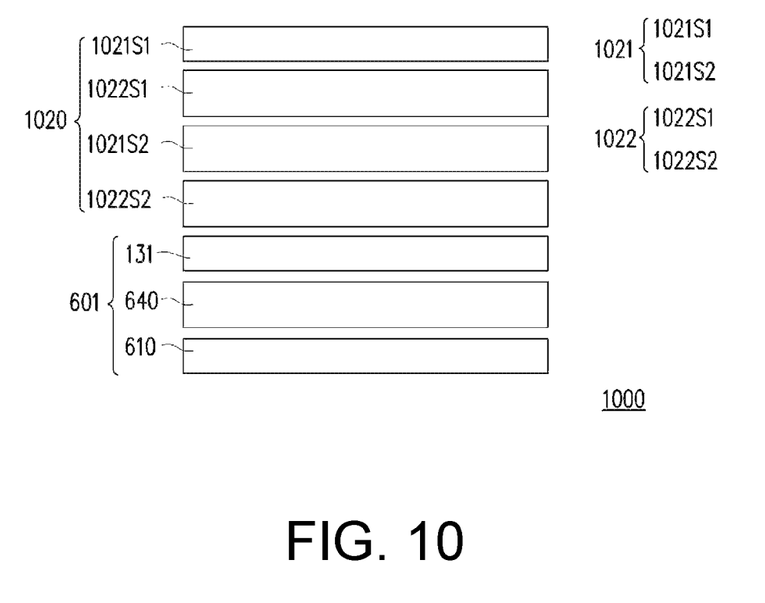

FIG. 10 is a schematic structural diagram of yet another display device according to an embodiment of the invention. Referring to FIG. 10, a display device 1000 in FIG. 10 is similar to the display device 400 in FIG. 4, and the differences are as follows. In the embodiment, a view angle adjustment layer 1022 of a view angle switching module 1020 includes a plurality of sub-view angle adjustment layers 1022S1 and 1022S2. A first polarizer 1021 further includes a plurality of first sub-polarizers 1021S1 and 1021S2. Each of the first sub-polarizers 1021S1 and 1021S2 and each of the sub-view angle adjustment layers 1022S1 and 1022S2 are staggered and overlapped. In other words, in the embodiment, the first sub-polarizer 1021S2 located between two adjacent sub-view angle adjustment layers 1022S1 and 1022S2 may be used as an upper polarizer of one of the sub-view angle adjustment layers 1022S2 and a lower polarizer of the other sub-view angle adjustment layer 1022S1. On the other hand, the uppermost first sub-polarizer 1021S1 is used as an upper polarizer of the uppermost sub-view angle adjustment layer 1022S1. The second polarizer 131 is used as a lower polarizer of the lowermost sub-view angle adjustment layer 1022S2. Moreover, the arrangement direction of the transmission axes of the polarizers used as the upper and lower polarizers of the sub-view angle adjustment layers 1022S1 and 1022S2 is the same as the arrangement direction of the transmission axes of the first polarizer 121 and the second polarizer 131 of the view angle switching module 120. Related details are shown with respect to relevant paragraphs. The descriptions thereof are omitted herein. In this way, by means of the configuration of the plurality of sub-view angle adjustment layers 1022S1 and 1022S2, the view angle switching module 1020 may adjust a view angle of an illumination beam for multiple times. In this way, the privacy view of the display device 1000 may be further reduced, or the display device may be used in combination with the self-luminous display module 601 that provides an illumination beam in a large divergence angle.

Moreover, in the embodiment, an average degree of polarization of at least one of these first sub-polarizers 1021S1 and 1021S2 for the light with the wavelength falling within the first wavelength band is less than the average degree of polarization of the second polarizer 131 for the light with the wavelength falling within the first wavelength band, and is less than an average degree of polarization for the light with the wavelength falling within the second wavelength band. That is, in the embodiment, an average degree of polarization of the first polarizer 1021 for the light with the wavelength falling within the first wavelength band is less than the average degree of polarization of the second polarizer 131 for the light with the wavelength falling within the first wavelength band.

In this way, by means of a configuration in which the average degree of polarization of the first polarizer 1021 for the light with the wavelength falling within the first wavelength band is less than the average degree of polarization of the second polarizer 131 for the light with the wavelength falling within the first wavelength band, the display device 1000 can increase a proportion of the light, with the wavelength falling within the first wavelength band, passing through the view angle switching module 1020. Therefore, the display device 1000 in the privacy mode can compensate for a color shift at a specific view angle. In this way, while providing a privacy function, the display device 1000 may also provide images with good image quality and improve the comfort of a user during use. The display device can have the advantages mentioned in the foregoing display device 400. The descriptions thereof are omitted herein.

Figure 11:
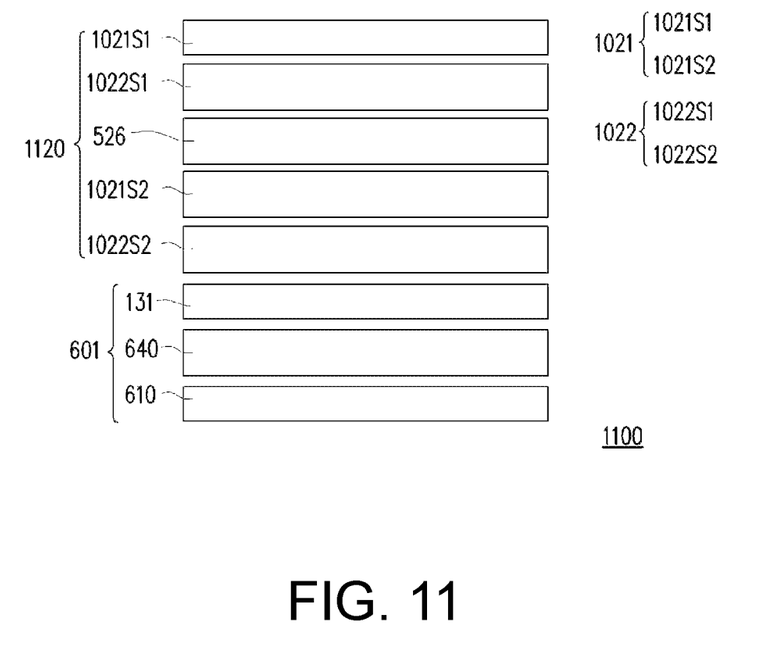

FIG. 11 is a schematic structural diagram of yet another display device according to an embodiment of the invention. Referring to FIG. 11, a display device 1100 in FIG. 11 is similar to the display device 1000 in FIG. 10, and the differences are as follows. In the embodiment, a view angle switching module 1120 further includes a reflective polarizer

526, located between one of the sub-view angle adjustment layers 1022 S1 and the first sub-polarizer 1021S2 as the upper polarizer of the other sub-view angle adjustment layer 1022S2. More specifically, in the embodiment, the reflective polarizer 526 and the other first sub-polarizer 1021S1 are used as the upper and lower polarizers of one of the sub-view angle adjustment layers 1022S1. That is, the arrangement direction of the transmission axes of the first sub-polarizer 1021S1 and the reflective polarizer 526 is the same as the arrangement direction of the transmission axes of the first polarizer 121 and the second polarizer 131 of the view angle switching module 120 in FIG. 1. Related details are shown with respect to relevant paragraphs. The descriptions thereof are omitted herein. In this way, by means of the configuration of the plurality of sub-view angle adjustment layers 1022S1 and 1022S2, the view angle switching module 1120 may adjust a view angle of an illumination beam for multiple times. In this way, the privacy view angle of the display device 1100 may be further reduced, or the display device may be used in combination with a light source module 610 that provides an illumination beam in a large divergence angle.

Moreover, in the embodiment, by means of a configuration in which the average degree of polarization of the first polarizer 1021 for the light with the wavelength falling within the first wavelength band is less than the average degree of polarization of the second polarizer 131 for the light with the wavelength falling within the first wavelength band, the display device 1100 can increase a proportion of the light, with the wavelength falling within the first wavelength band, passing through the view angle switching module 1120. Therefore, the display device 1100 in the privacy mode can compensate for a color shift at a specific view angle. In this way, while providing a privacy function, the display device 1100 may also provide images with good image quality and improve the comfort of a user during use. The display device can have the advantages mentioned in the foregoing display device 1000. The descriptions thereof are omitted herein.

To sum up, one or more embodiments of the invention have at least one of the following advantages or effects. In the display device provided in one or more embodiments of the invention, since the degree of polarization of the first polarizer for the light with the wavelength falling within the first wavelength band is less than the degree of polarization of the second polarizer for the light with the wavelength falling within the first wavelength band, a proportion of the light, with the wavelength falling within the first wavelength band, passing through the view angle switching module may be increased. Therefore, the display device in a privacy mode may compensate for a color shift at a specific view angle. As such, while performing the privacy function, the display device may also provide the images with good image quality and improve the comfort of a user during use.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to the use of "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

What is claimed is:

1. A display device, comprising a view angle switching module and a display module, wherein
the view angle switching module comprises a first polarizer and a view angle adjustment layer,
the display module and the view angle switching module are overlapped, and the display module comprises a display layer and a second polarizer, wherein
the view angle adjustment layer is located between the first polarizer and the second polarizer, and an average degree of polarization of the first polarizer for light with a wavelength falling within a first wavelength band is less than an average degree of polarization of the second polarizer for the light with the wavelength falling within the first wavelength band, the average degree of polarization of the first polarizer for the light with the wavelength falling within the first wavelength band is less than an average degree of polarization of the first polarizer for light with a wavelength falling within a second wavelength band, and a difference value between the average degree of polarization of the first polarizer for the light with the wavelength falling within the first wavelength band and falling within the second wavelength band is larger than 3%.

2. The display device according to claim 1, further comprising a light source module configured to provide an illumination beam, the view angle switching module being disposed on a transmission path of the illumination beam,
wherein the display module is disposed on the transmission path of the illumination beam and further comprises a third polarizer, the display layer is located between the second polarizer and the third polarizer, the second polarizer is located between the view angle adjustment layer and the display layer, the illumination beam forms a display beam via the view angle switching module and the display module, and the average degree of polarizations of the second polarizer and the third polarizer for the light with the wavelength falling within the first wavelength band are the same.

3. The display device according to claim 1, wherein the first wavelength band is from 410 nm to 500 nm, and the second wavelength band is from 530 nm to 570 nm.

4. The display device according to claim 1, wherein the average degree of polarization of the first polarizer for the light with the wavelength falling within the first wavelength band is from 45% to 90%.

5. The display device according to claim 1, wherein the average degree of polarization of the first polarizer for the light with the wavelength falling within the second wavelength band is from 85% to 99.999%.

6. The display device according to claim 1, further comprising a reflective polarizer located between the view angle adjustment layer and the second polarizer.

7. The display device according to claim 1, wherein the view angle switching module further comprises at least one compensation film located between the first polarizer and the view angle adjustment layer.

8. The display device according to claim 1, wherein the display layer is a self-luminous display layer, and the second polarizer is located between the view angle adjustment layer and the display layer.

9. The display device according to claim 8, further comprising a view angle control film, wherein the first polarizer is located between the view angle control film and the view angle adjustment layer.

10. A display device, comprising a view angle switching module and a display module, wherein
the view angle switching module comprises a first polarizer and a view angle adjustment layer,
the display module and the view angle switching module are overlapped, and the display module comprises a display layer and a second polarizer, wherein
the view angle adjustment layer is located between the first polarizer and the second polarizer, and an average degree of polarization of the first polarizer for light with a wavelength falling within a first wavelength band is less than an average degree of polarization of the second polarizer for the light with the wavelength falling within the first wavelength band,
wherein the average degree of polarization of the first polarizer for the light with the wavelength falling within the first wavelength band is less than an average degree of polarization of the first polarizer for light with a wavelength falling within a second wavelength band, and
the display device further comprises a fourth polarizer located between the view angle adjustment layer and the second polarizer, wherein the first polarizer, the view angle adjustment layer, and the fourth polarizer form the view angle switching module, the view angle switching module is disposed on a transmission path of an illumination beam, the illumination beam forms a display beam via the view angle switching module and the display module, an average degree of polarization of the fourth polarizer for the light with the wavelength falling within the first wavelength band is less than the average degree of polarization of the second polarizer for the light with the wavelength falling within the first wavelength band, and the average degree of polarization of the fourth polarizer for the light with the wavelength falling within the first wavelength band is less than an average degree of polarization of the fourth polarizer for the light with the wavelength falling within the second wavelength band.

11. A display device, comprising a view angle switching module and a display module, wherein
the view angle switching module comprises a first polarizer and a view angle adjustment layer,
the display module and the view angle switching module are overlapped, and the display module comprises a display layer and a second polarizer, wherein
the view angle adjustment layer is located between the first polarizer and the second polarizer, and an average degree of polarization of the first polarizer for light with a wavelength falling within a first wavelength band is less than an average degree of polarization of the second polarizer for the light with the wavelength falling within the first wavelength band, and
the display device further comprises a light source module configured to provide an illumination beam, the view angle switching module being disposed on a transmission path of the illumination beam,
wherein the display module is disposed on the transmission path of the illumination beam and further comprises a third polarizer, the display layer is located between the second polarizer and the third polarizer, the second polarizer is located between the view angle adjustment layer and the display layer, the illumination beam forms a display beam via the view angle switching module and the display module, and the average degree of polarizations of the second polarizer and the third polarizer for the light with the wavelength falling within the first wavelength band are the same,
wherein the view angle adjustment layer comprises a plurality of sub-view angle adjustment layers, the view angle switching module further comprises at least one fifth polarizer, each of the at least one fifth polarizer is located between two adjacent sub-view angle adjustment layers of the plurality of sub-view angle adjustment layers, and an average degree of polarization of each of the at least one fifth polarizer for the light with the wavelength falling within the first wavelength band is less than the average degree of polarization of the second polarizer for the light with the wavelength falling within the first wavelength band.

12. A display device, comprising a view angle switching module and a display module, wherein
the view angle switching module comprises a first polarizer and a view angle adjustment layer,
the display module and the view angle switching module are overlapped, and the display module comprises a display layer and a second polarizer, wherein
the view angle adjustment layer is located between the first polarizer and the second polarizer, and an average degree of polarization of the first polarizer for light with a wavelength falling within a first wavelength band is less than an average degree of polarization of the second polarizer for the light with the wavelength falling within the first wavelength band, and
wherein the display layer is a self-luminous display layer, and the second polarizer is located between the view angle adjustment layer and the display layer, the view angle adjustment layer comprises a plurality of sub-view angle adjustment layers, the first polarizer further comprises a plurality of first sub-polarizers, each of the plurality of first sub-polarizers and each of the plurality of sub-view angle adjustment layers are staggered and overlapped, and an average degree of polarization of at least one of the plurality of first sub-polarizers for the light with the wavelength falling within the first wavelength band is less than the average degree of polarization of the second polarizer for the light with the wavelength falling within the first wavelength band and is less than an average degree of polarization for light with a wavelength falling within a second wavelength band.

* * * * *